US012200889B2

(12) United States Patent
Chu et al.

(10) Patent No.: US 12,200,889 B2
(45) Date of Patent: Jan. 14, 2025

(54) POWER SUPPLY DEVICE WITH STACKED CIRCUIT BOARDS AND THERMAL GEL CONTACTING MAGNETIC MEMBER

(71) Applicant: DELTA ELECTRONICS, INC., Taoyuan (TW)

(72) Inventors: Chia-Hsien Chu, Taoyuan (TW); Chih-Chiang Chan, Taoyuan (TW); Yi-Hua Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 400 days.

(21) Appl. No.: 17/653,657

(22) Filed: Mar. 7, 2022

(65) Prior Publication Data

US 2023/0061748 A1 Mar. 2, 2023

(30) Foreign Application Priority Data

Aug. 31, 2021 (CN) .......................... 202122078192.6

(51) Int. Cl.
| H05K 7/12 | (2006.01) |
| H01R 11/30 | (2006.01) |
| H01R 13/62 | (2006.01) |
| H05K 7/20 | (2006.01) |

(52) U.S. Cl.
CPC .............. *H05K 7/12* (2013.01); *H01R 11/30* (2013.01); *H01R 13/6205* (2013.01); *H05K 7/20154* (2013.01)

(58) Field of Classification Search
CPC .... H05K 7/12; H05K 7/20154; H05K 7/1432; H01R 11/30; H01R 13/6205
See application file for complete search history.

(56) References Cited

U.S. PATENT DOCUMENTS

| 6,144,571 A | * | 11/2000 | Sasaki | H01L 25/165 |
| | | | | 257/E25.031 |
| 6,690,582 B2 | * | 2/2004 | Sumida | H01R 9/226 |
| | | | | 361/752 |
| 6,724,639 B2 | * | 4/2004 | Tsai | H05K 5/0069 |
| | | | | 361/784 |
| 7,048,564 B1 | | 5/2006 | Hinze | |
| 9,385,631 B2 | * | 7/2016 | Kontani | H02M 7/53871 |
| 2009/0103276 A1 | * | 4/2009 | Sakamoto | H05K 5/065 |
| | | | | 29/841 |
| 2013/0235527 A1 | | 9/2013 | Wagner et al. | |
| 2015/0145469 A1 | | 5/2015 | You et al. | |

FOREIGN PATENT DOCUMENTS

| CN | 201878469 U | 6/2011 |
| CN | 103296863 B | 3/2017 |
| CN | 208924090 U | 5/2019 |
| TW | 201811592 A | 4/2018 |
| TW | I713831 B | 12/2020 |

\* cited by examiner

*Primary Examiner* — Travis S Chambers
(74) *Attorney, Agent, or Firm* — CKC & Partners Co., LLC

(57) ABSTRACT

A power supply device includes at least one magnetic member, a first circuit board and a second circuit board. The first circuit board is disposed over the magnetic member and is electrically connected to the magnetic member. The first circuit board has an opening. The second circuit board is electrically connected to the first circuit board. The second circuit board is disposed over the first circuit board and faces the opening of the first circuit board.

11 Claims, 7 Drawing Sheets

POWER SUPPLY DEVICE WITH STACKED CIRCUIT BOARDS AND THERMAL GEL CONTACTING MAGNETIC MEMBER

RELATED APPLICATIONS

This application claims priority to China Application Serial Number 202122078192.6, filed Aug. 31, 2021, the disclosure of which is incorporated herein by reference in its entirety.

BACKGROUND

Technical Field

The present disclosure relates to a power supply device.

Description of Related Art

Power supply and power converter, which serve to convert an input power to an output power suitable for the connected load, conventionally use single-circuit-board design. Other components need to be connected or welded to the circuit board before being installed into the casing together with the circuit board. However, this approach could cause the collision of the components during the assembly process, and moreover, makes the device difficult to repair and replace components. Furthermore, conventional power supply and power converter use thermal pad for heat dissipation. Thermal pad is problematic for repairing and quality control, since thermal pad needs to be manually pasted and is difficult to remove.

SUMMARY

In view of the foregoing, one of the objects of the present disclosure is to provide a power supply device that is easy to assemble and repair.

To achieve the objective stated above, in accordance with an embodiment of the present disclosure, a power supply device includes at least one magnetic member, a first circuit board and a second circuit board. The first circuit board is disposed over the magnetic member and is electrically connected to the magnetic member. The first circuit board has an opening. The second circuit board is electrically connected to the first circuit board. The second circuit board is disposed over the first circuit board and faces the opening of the first circuit board.

In one or more embodiments of the present disclosure, the power supply device further includes a thermal gel. The thermal gel is disposed in the opening of the first circuit board and is in contact with the second circuit board.

In one or more embodiments of the present disclosure, the power supply device further includes a casing and a fastener. The casing accommodates the magnetic member, the first circuit board and the second circuit board. The thermal gel is arranged between the casing and the second circuit board. The fastener passes through the second circuit board and the opening of the first circuit board and fixedly engages the casing.

In one or more embodiments of the present disclosure, the power supply device further includes a plurality of positioning posts. The opening of the first circuit board has a plurality of corners. The positioning posts are disposed at two or more of the corners of the opening, and the positioning posts interlock with the second circuit board.

In one or more embodiments of the present disclosure, the first circuit board comprises at least one socket arranged on a side of the opening, and the second circuit board comprises at least one pin electrically connected to the socket.

In one or more embodiments of the present disclosure, the power supply device further includes a casing and a thermal gel. The casing accommodates the magnetic member, the first circuit board and the second circuit board. The casing has a recess. The magnetic member is disposed in the recess. The thermal gel is disposed in the recess and covers the magnetic member.

In one or more embodiments of the present disclosure, the power supply device further includes a third circuit board and a plurality of connectors. The third circuit board is electrically connected to the first circuit board. The first circuit board, the second circuit board and the third circuit board are arranged in a stacked configuration. The connectors are disposed on the third circuit board.

In accordance with an embodiment of the present disclosure, a power supply device includes a casing, at least one magnetic member, a first circuit board, a second circuit board and a plurality of connectors. The casing has at least one opening. The magnetic member, the first circuit board and the second circuit board are disposed in the casing. The first circuit board is disposed over the magnetic member and is electrically connected to the magnetic member. The second circuit board is in a stack arrangement with the first circuit board and is electrically connected to the first circuit board. The connectors are disposed on the second circuit board and are located in the opening of the casing.

In one or more embodiments of the present disclosure, the power supply device further includes a pillar. The pillar is fixedly attached to the second circuit board and abuts against a bottom surface of the casing.

In one or more embodiments of the present disclosure, the second circuit board includes at least one conductive standoff structure, and the first circuit board is in contact with the conductive standoff structure.

In one or more embodiments of the present disclosure, the power supply device further includes at least one fastener. The fastener passes through the first circuit board and fixedly engages the conductive standoff structure of the second circuit board.

In one or more embodiments of the present disclosure, the power supply device further includes a thermal gel. The casing has a recess. The magnetic member is disposed in the recess. The thermal gel is disposed in the recess and covers the magnetic member.

In one or more embodiments of the present disclosure, the power supply device further includes at least one fastener. The magnetic member includes at least one conductive pin. The fastener passes through the first circuit board and fixedly engages the conductive pin of the magnetic member.

In sum, in the power supply device of the present disclosure, the magnetic member and a plurality of circuit boards are arranged in a stacked configuration, making the power supply device easy to assemble and repair. In addition, the power supply device of the present disclosure uses thermal gel for heat dissipation. Thermal gel can tightly contact the magnetic member, resulting in improved heat dissipation for the magnetic member.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
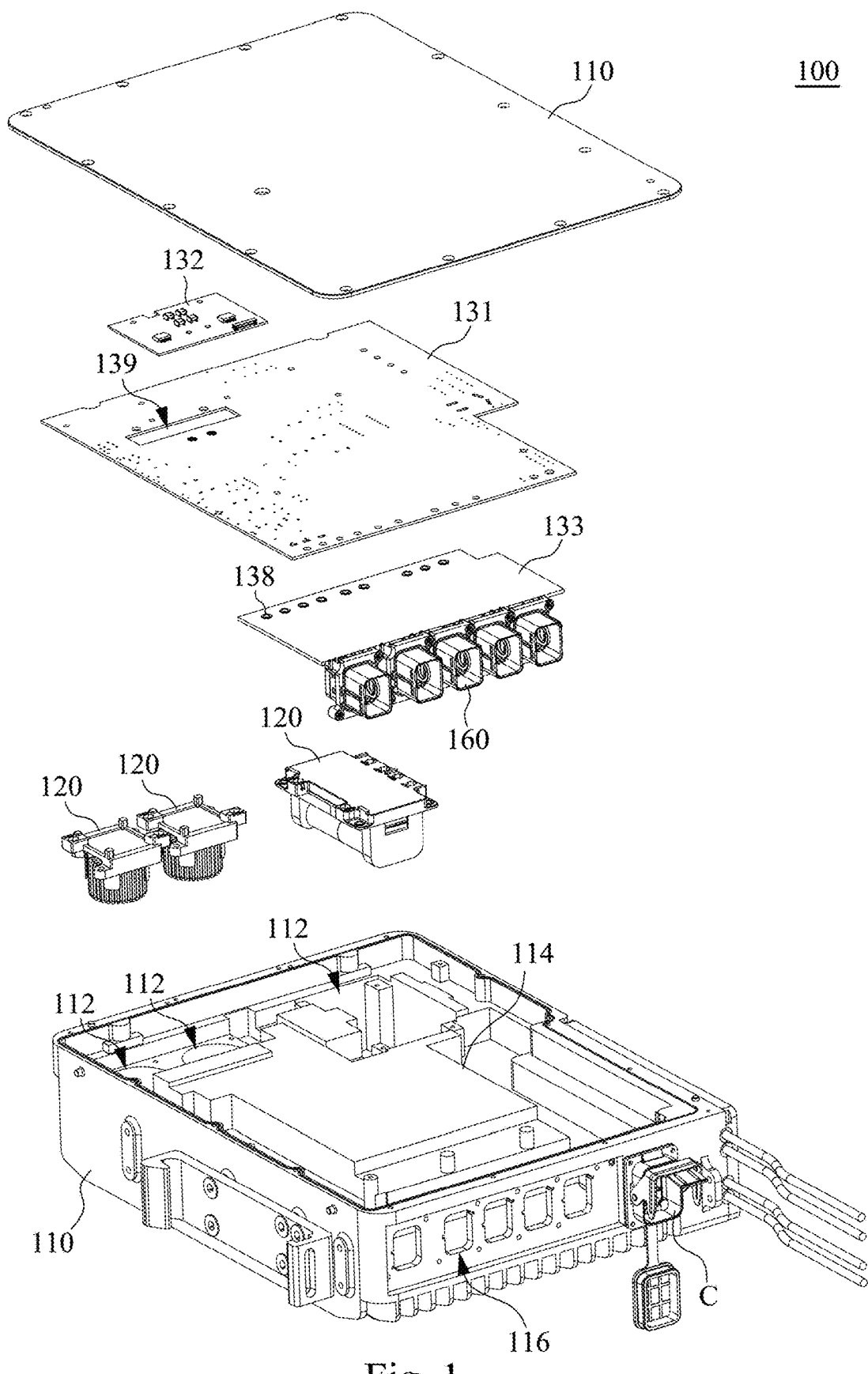
FIG. 1 illustrates an exploded view of a power supply device in accordance with an embodiment of the present disclosure.

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Figure 2:
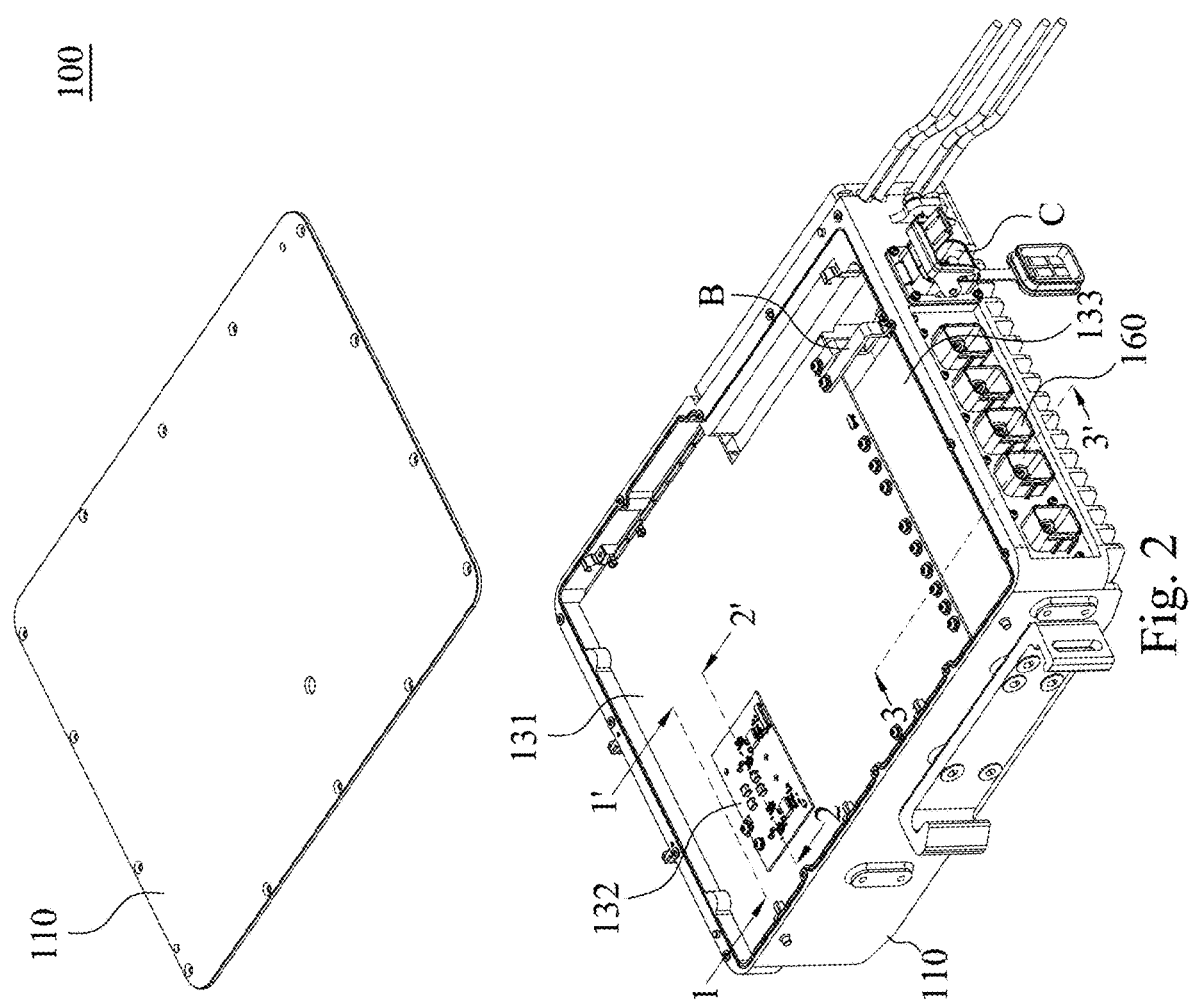
FIG. 2 illustrates an assembled view for the components inside the casing of the power supply device of FIG. 1.

Reference is made to FIGS. 1 and 2. FIG. 1 illustrates an exploded view of a power supply device 100 in accordance with an embodiment of the present disclosure. FIG. 2 illustrates an assembled view for the components inside the casing of the power supply device 100 of FIG. 1. The power supply device 100 (e.g., a rectifier) includes a casing 110 and at least one magnetic member 120. The casing 110 has at least one recess 112. The magnetic member 120 is disposed in the recess 112 of the casing 110. In some embodiments, the casing 110 includes a platform structure 114 in the interior of the casing 110. The recess 112, which is configured to receive the magnetic member 120, is formed on the platform structure 114. In some embodiments, the magnetic member 120 is fixedly attached to the casing 110 via one or more fasteners such as a screw (not depicted). For example, the magnetic member 120 may have one or more thru-holes (not depicted). The fasteners may pass through the thru-holes of the magnetic member 120 and fixedly engages the casing 110. In some embodiments, the magnetic member 120 may include PFC choke or LLC transformer.

As shown in FIGS. 1 and 2, the power supply device 100 further includes two circuit boards 131 and 132 disposed in the casing 110. The circuit board 131 is disposed over the magnetic member 120 and is electrically connected to the magnetic member 120. The circuit board 131 has an opening 139. The circuit board 132 is electrically connected to the circuit board 131. The circuit board 132 is disposed over the circuit board 131 and faces the opening 139 of the circuit board 131. One or more electronic components on the circuit board 132 may be received in the opening 139 of the circuit board 131.

As shown in FIGS. 1 and 2, in some embodiments, the circuit board 131 is disposed on the platform structure 114 of the casing 110, and the opening 139 of the circuit board 131 faces a top surface of the platform structure 114. The circuit board 132 is disposed on a side of the circuit board 131 away from the platform structure 114. In some embodiments, the circuit board 131 is a mainboard, and the circuit board 132 is a switch board for PFC choke or LLC transformer.

As shown in FIGS. 1 and 2, the power supply device 100 further includes a circuit board 133 (e.g., an I/O board) and a plurality of connectors 160, both of which are disposed in the casing 110. The circuit board 133 is disposed underneath the circuit board 131 and is electrically connected to the circuit board 131. The casing 110 has at least one opening 116. The connectors 160 are disposed on the circuit board 133 and are located in the opening 116 of the casing 110. The circuit boards 131, 132 and 133 are arranged in a stacked configuration inside the casing 110.

As shown in FIGS. 1 and 2, in some embodiments, the circuit board 133 is disposed on a side of the platform structure 114 that faces the opening 116, and the circuit board 133 partially extends to the underneath of the circuit board 131. In some embodiments, the circuit boards 132 and 133 are located on opposite sides of the circuit board 131.

As shown in FIGS. 1 and 2, the connectors 160 may include a power input interface (e.g., AC input interface) and one or more power output interfaces (e.g., DC output interface), or one or more communication interfaces. The connectors 160 are exposed out of the casing 110 through the opening 116 of the casing 110, such that the connectors 160 can be connected to an external power source or a load. In some embodiments, the power supply device 100 further includes a battery connector C. The battery connector C is connected to the circuit board 131 via one or more bus connectors B. The battery connector C is configured to be connected to an external battery (not depicted).

The power supply device 100 of the present disclosure includes a plurality of circuit boards (e.g., the circuit boards 131, 132 and 133). Compared to the conventional single-circuit-board design, using multiple circuit boards can keep each circuit board light and thus easier to install. In addition, in the power supply device 100 of the present disclosure, the magnetic member 120 and the circuit boards 131, 132 and 133 are arranged a stacked configuration. The magnetic member 120 and the circuit boards 131, 132 and 133 can thus be assembled into the casing 110 one by one. This configuration makes the power supply device 100 easy to assemble and disassemble for repair or component replacement. Moreover, collisions of electronic components during the assembly process can be avoided.

In some embodiments, the power supply device 100 of the present disclosure may be assembled in the following order: (1) placing the magnetic member 120 in the recess 112 of the casing 110; (2) thereafter, placing the circuit board 133 and the connectors 160 in the casing 110 and exposing the connectors 160 through the opening 116 of the casing 110; (3) thereafter, positioning the circuit board 131 over the magnetic member 120 and the circuit board 133, and electrically connecting the circuit board 131 to the magnetic member 120 and the circuit board 133; (4) thereafter, positioning the circuit board 132 to face the opening 139 of the circuit board 131, and mounting the circuit board 132 on the circuit board 131 in a way that electrically connects the circuit boards 131 and 132.

It should be realized that the present disclosure is not limited to the embodiment where the power supply device 100 includes three circuit boards. In some embodiments, the power supply device 100 may include two circuit boards in a stack arrangement (e.g., any two of the circuit boards 131, 132 and 133 may be combined into one). In some embodiments, the power supply device 100 may include four or more circuit boards in a stack arrangement (e.g., at least one of the circuit boards 131, 132 and 133 may be split into multiple boards carrying electronic components with different functions).

Figure 3:
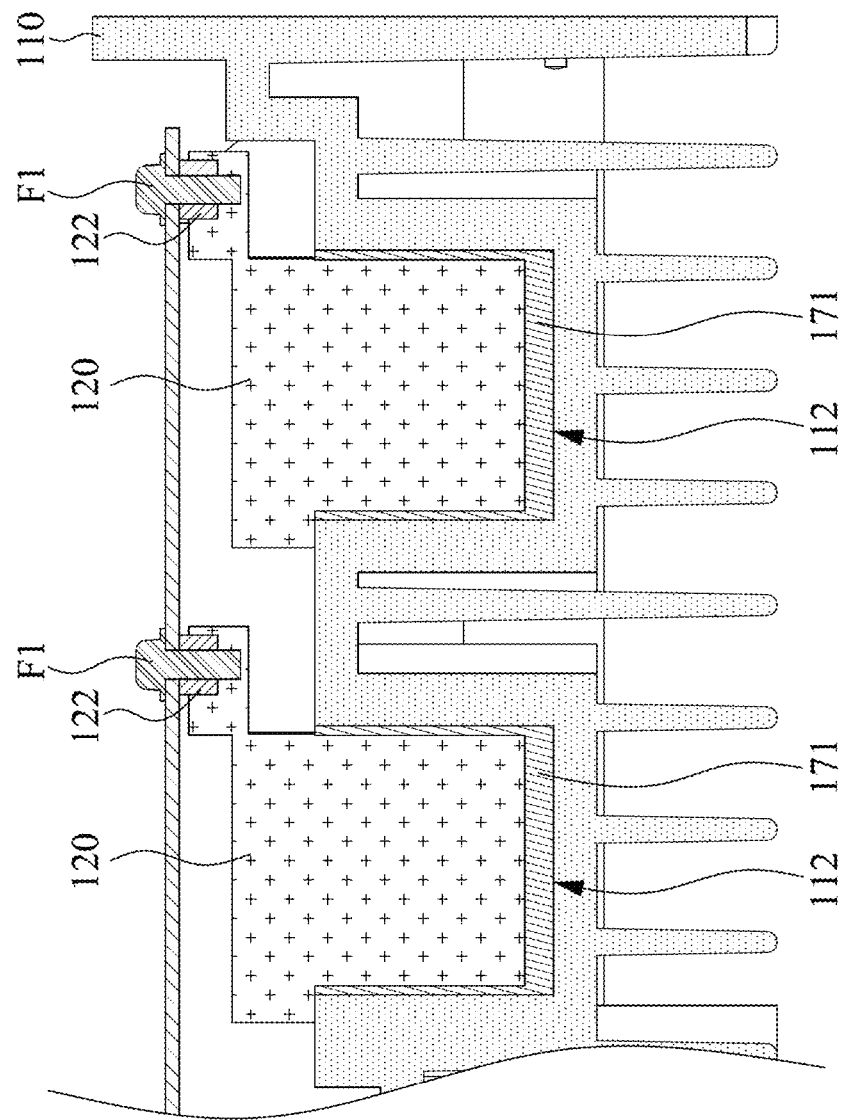
FIG. 3 illustrates a sectional view of the power supply device shown in FIG. 2 taken along line segment 1-1'.

Reference is made to FIG. 3. FIG. 3 illustrates a sectional view of the power supply device 100 shown in FIG. 2 taken along line segment 1-1'. In certain use cases (e.g., outdoor usage), the power supply device 100 is required to be waterproof and thus cannot use any active cooling device such as a fan. In view of this, in some embodiments, the power supply device 100 further includes a thermal gel 171. The thermal gel 171 is disposed in the recess 112 of the casing 110 and covers the magnetic member 120. The thermal gel 171 is in contact with both the casing 110 and the magnetic member 120. Accordingly, the thermal gel 171 can transfer the heat generated by the magnetic member 120 to the casing 110 to take advantage of the larger outer surface of the casing 110 to speed up heat dissipation. The thermal gel 171 can tightly contact the magnetic member 120, and thus the thermal gel 171 can more effectively transfer heat away from the magnetic member 120. As a result, heat dissipation for the magnetic member 120 is improved.

As shown in FIG. 3, in some embodiments, the assembly process of the power supply device 100 may include: (1) injecting a predetermined amount of thermal gel 171 into the recess 112 of the casing 110; and (2) thereafter, placing the magnetic member 120 in the recess 112, such that the thermal gel 171 covers the magnetic member 120. This approach can avoid generating bubbles in the thermal gel 171, which may slow down heat transfer.

As shown in FIG. 3, in some embodiments, the magnetic member 120 includes at least one conductive pin 122 contacting the circuit board 131. The power supply device 100 further includes at least one fastener F1. The fastener F1 passes through the circuit board 131 and fixedly engages the conductive pin 122 of the magnetic member 120 (e.g., the fastener F1 may be screwed into the conductive pin 122). By this arrangement, a reliable electrical connection can be formed between the magnetic member 120 and the circuit board 131.

As shown in FIG. 3, in some embodiments, the assembly process of the power supply device 100 may include: (1) positioning the circuit board 131 in a way that it makes contact with the conductive pin 122 of the magnetic member 120; and (2) thereafter, positioning the fastener F1 through the circuit board 131 and fixedly engaging the fastener F1 to the conductive pin 122, thereby forming an electrical connection between the magnetic member 120 and the circuit board 131.

Figure 4:
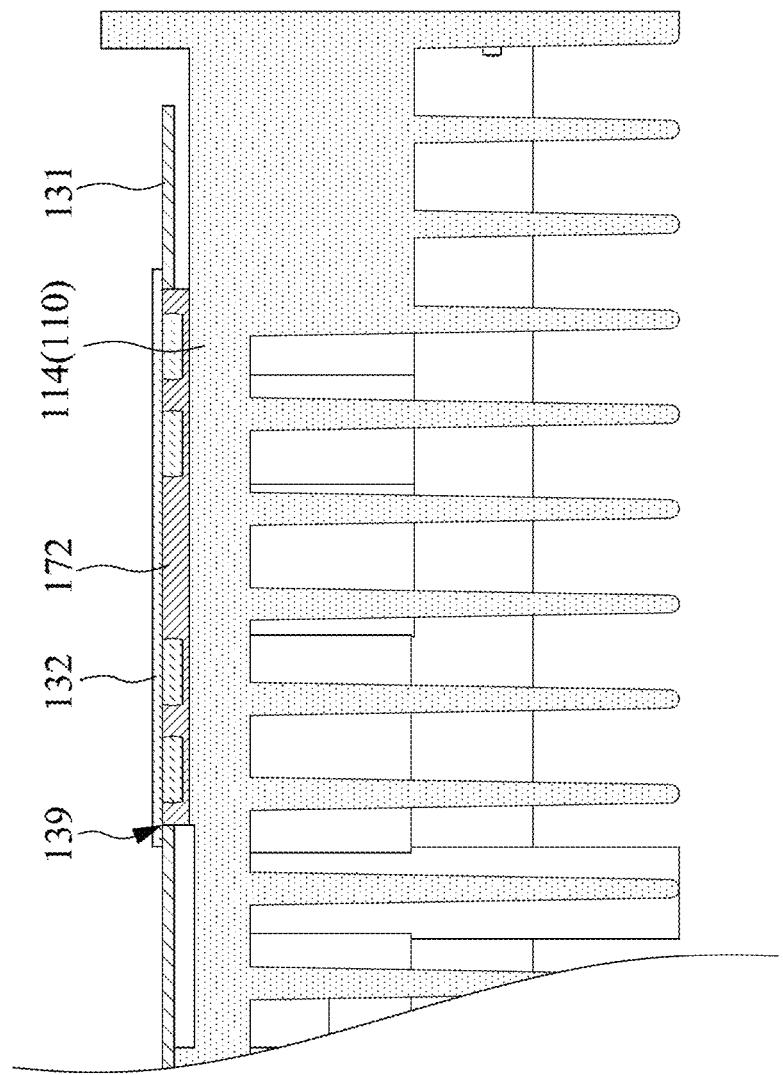
FIG. 4 illustrates a sectional view of the power supply device shown in FIG. 2 taken along line segment 2-2'.

Reference is made to FIG. 4. FIG. 4 illustrates a sectional view of the power supply device 100 shown in FIG. 2 taken along line segment 2-2'. In some embodiments, the power supply device 100 further includes a thermal gel 172. The thermal gel 172 is disposed in the opening 139 of the circuit board 131 and is in contact with the circuit board 132. The thermal gel 172 is also in contact with the casing 110 (e.g., the thermal gel 172 may contact the top surface of the platform structure 114), and can thus transfer the heat generated by the electronic components on the circuit board 132 to the casing 110.

As shown in FIG. 4, in some embodiments, the assembly process of the power supply device 100 may include: (1) injecting a predetermined amount of thermal gel 171 into the opening 139 of the circuit board 131; and (2) thereafter, positioning the circuit board 132 to face the opening 139 and mounting the circuit board 132 on the circuit board 131, such that the thermal gel 172 contacts the circuit board 132 and the electronic components on the circuit board 132.

Figure 5:
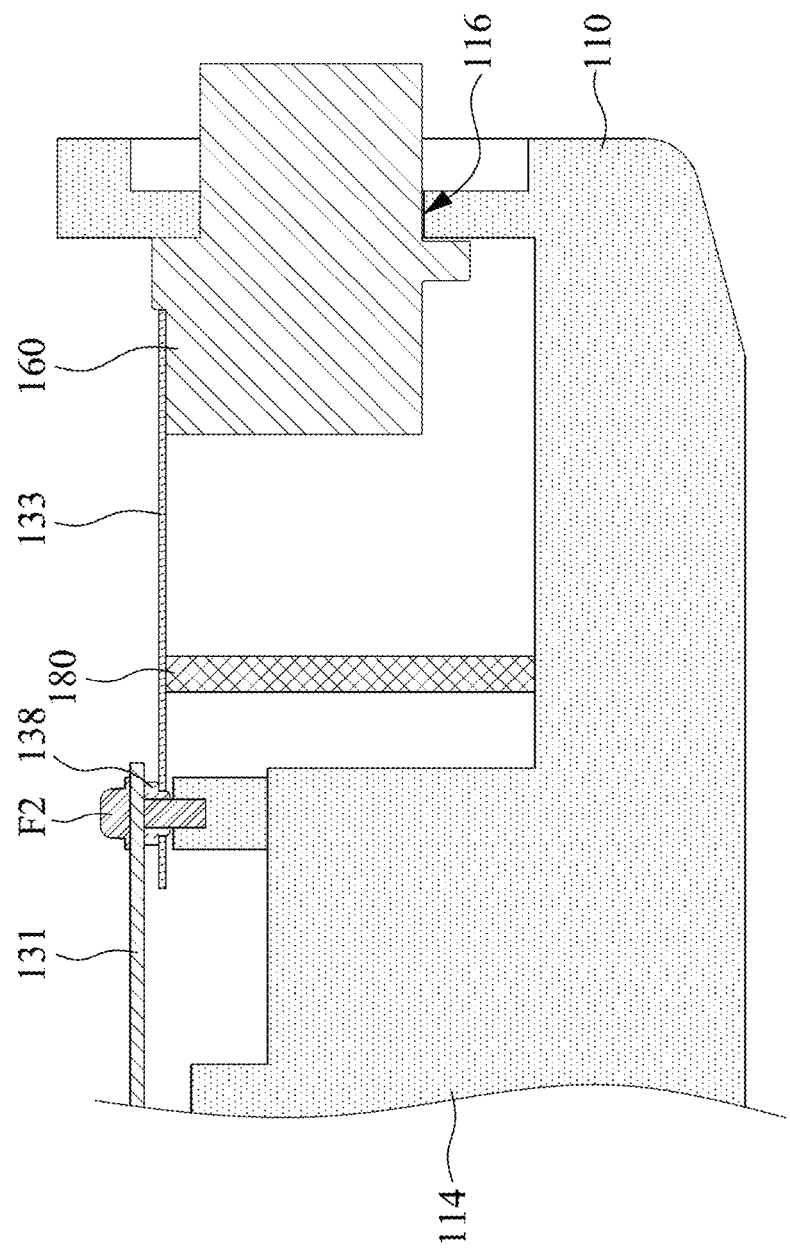
FIG. 5 illustrates a sectional view of the power supply device shown in FIG. 2 taken along line segment 3-3'.

Reference is made to FIG. 5. FIG. 5 illustrates a sectional view of the power supply device 100 shown in FIG. 2 taken along line segment 3-3'. In some embodiments, the power supply device 100 further includes a pillar 180. The pillar 180 has two opposite ends, including a first end fixedly attached to the circuit board 133 and a second end abutting against a bottom surface of the casing 110. The pillar 180 can provide mechanical support for the circuit board 133. Specifically, the pillar 180 can help reduce the mechanical stress incurred by the circuit board 133 during the assembly process to prevent damage to the circuit board 133. In some embodiments, the pillar 180 may be fixedly attached to the circuit board 133 via a screw or other fasteners (not depicted).

As shown in FIG. 5, in some embodiments, the circuit board 133 includes at least one conductive standoff structure 138 rising from a surface of the circuit board 133. The circuit board 131 is electrically connected to the circuit board 133 by making contact with the conductive standoff structure 138.

As shown in FIG. 5, in some embodiments, the power supply device 100 further includes at least one fastener F2. The fastener F2 passes through the circuit board 131 and fixedly engages the conductive standoff structure 138 of the circuit board 133 (e.g., the fastener F2 may be screwed into a hole at the center of the conductive standoff structure 138). By this arrangement, a reliable electrical connection can be formed between the circuit boards 131 and 133. In some embodiments, the fastener F2 passes through the conductive standoff structure 138 and fixedly engages the casing 110, such that the circuit boards 131 and 133 are held fixed to the casing 110 by the fastener F2.

As shown in FIG. 5, in some embodiments, the assembly process of the power supply device 100 may include: (1) positioning the circuit board 131 in a way that it makes contact with the conductive standoff structure 138 of the circuit board 133; and (2) thereafter, positioning the fastener F2 through the circuit board 131 and fixedly engaging the fastener F2 to the conductive standoff structure 138, thereby forming an electrical connection between the circuit boards 131 and 133.

Figure 6:
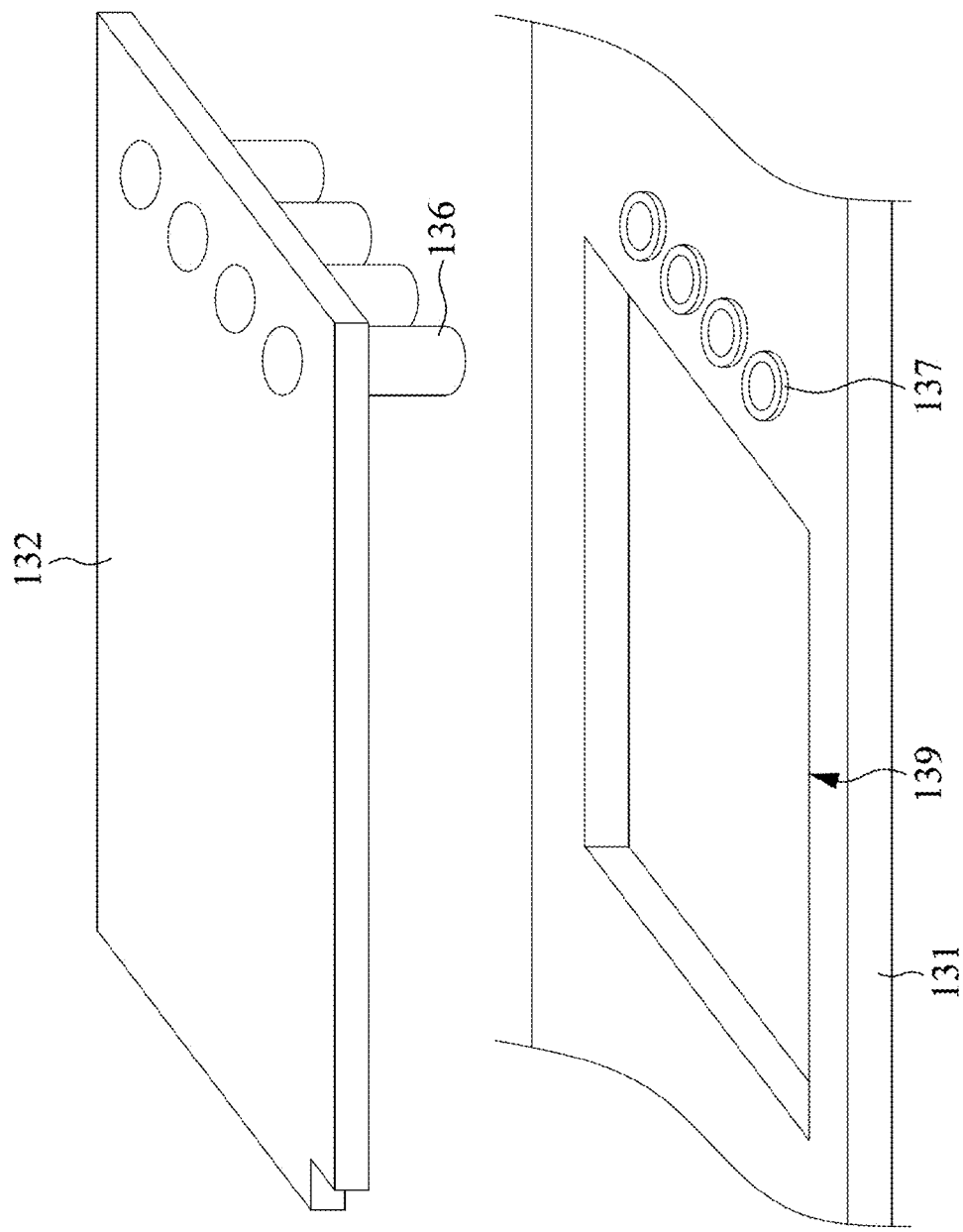
FIG. 6 is a schematic exploded view showing two circuit boards of a power supply device in accordance with another embodiment of the present disclosure.

Reference is made to FIG. 6. In some embodiments, the circuit board 131 includes at least one socket 137 arranged on a side of the opening 139. The circuit board 132 includes at least one pin 136 inserted into the socket 137 and electrically connected to the socket 137. The socket 137 and the pin 136 include electrically conductive material. The circuit boards 131 and 132 are electrically connected to each other through the socket 137 and pin 136. Using the socket 137 and the pin 136 for electrical connection makes the circuit boards 131 and 132 easy to assemble and disassemble, which in turn makes the power supply device 100 easier to repair.

Figure 7:
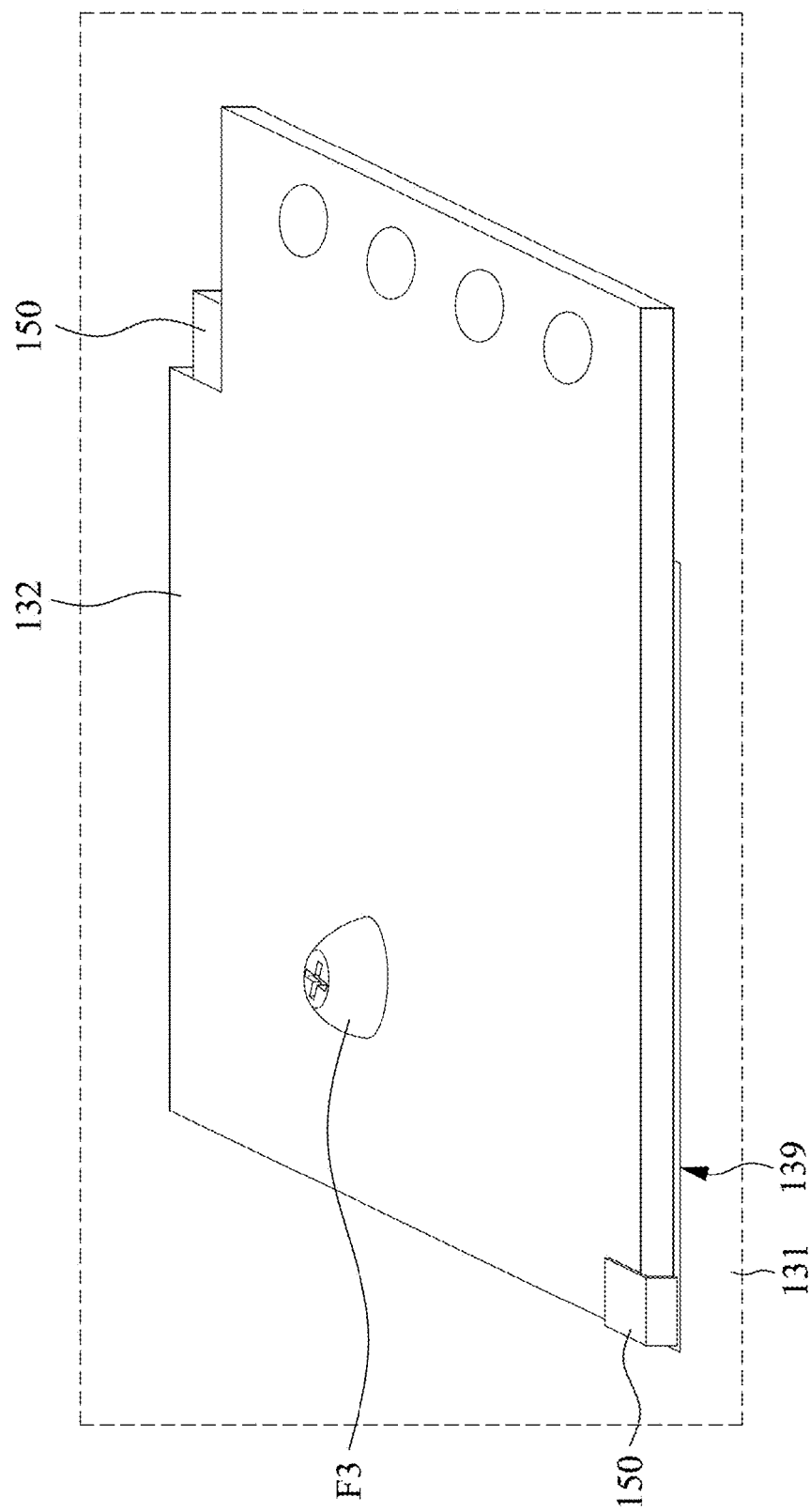
FIG. 7 is a schematic assembled view showing two circuit boards of a power supply device in accordance with another embodiment of the present disclosure.

Reference is made to FIG. 7. In some embodiments, the power supply device further includes a fastener F3. The fastener F3 passes through the circuit board 132 and the opening 139 of the circuit board 131 and fixedly engages the casing 110 (see FIG. 4). The fastener F3 can provide a pressing force to the circuit board 132 and the thermal gel 172 (see FIG. 4) beneath the circuit board 132, such that heat transfer can be sped up.

As shown in FIG. 7, in some embodiments, the power supply device further includes a plurality of positioning posts 150. The opening 139 of the circuit board 131 has a plurality of corners. The positioning posts 150 are each disposed at one of the corners of the opening 139, and the positioning posts 150 interlock with the circuit board 132. The positioning posts 150 can help spread out the mechanical stress generated from screwing the fastener F3 into the circuit board 132 to prevent damage to the circuit board 132.

In sum, in the power supply device of the present disclosure, the magnetic member and a plurality of circuit boards are arranged in a stacked configuration, making the power supply device easy to assemble and repair. In addition, the power supply device of the present disclosure uses thermal gel for heat dissipation. Thermal gel can tightly contact the magnetic member, resulting in improved heat dissipation for the magnetic member.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. A power supply device, comprising:
   at least one magnetic member;
   a first circuit board disposed over the magnetic member and electrically connected to the magnetic member, wherein the first circuit board has an opening;
   a second circuit board electrically connected to the first circuit board, wherein the second circuit board is disposed over the first circuit board and faces the opening of the first circuit board; and
   a first thermal gel, wherein the first thermal gel is disposed in the opening of the first circuit board and is in contact with the second circuit board.

2. The power supply device of claim 1, further comprising:
   a casing accommodating the magnetic member, the first circuit board and the second circuit board, wherein the first thermal gel is arranged between the casing and the second circuit board; and
   a fastener passing through the second circuit board and the opening of the first circuit board and fixedly engaging the casing.

3. The power supply device of claim 2, further comprising a plurality of positioning posts, wherein the opening of the first circuit board has a plurality of corners, the positioning posts are disposed at two or more of the corners of the opening, and the positioning posts interlock with the second circuit board.

4. The power supply device of claim 1, wherein the first circuit board comprises at least one socket arranged on a side of the opening, and the second circuit board comprises at least one pin electrically connected to the socket.

5. The power supply device of claim 1, further comprising:
   a casing accommodating the magnetic member, the first circuit board and the second circuit board, wherein the casing has a recess, and the magnetic member is disposed in the recess; and
   a second thermal gel disposed in the recess and covering the magnetic member.

6. A power supply device, comprising:
   at least one magnetic member;
   a first circuit board disposed over the magnetic member and electrically connected to the magnetic member, wherein the first circuit board has an opening;
   a second circuit board electrically connected to the first circuit board, wherein the second circuit board is disposed over the first circuit board and faces the opening of the first circuit board;
   a third circuit board electrically connected to the first circuit board, wherein the first circuit board, the second circuit board and the third circuit board are arranged in a stacked configuration; and
   a plurality of connectors disposed on the third circuit board.

7. A power supply device, comprising:
   a casing having at least one opening;
   at least one magnetic member disposed in the casing;
   a first circuit board disposed in the casing, wherein the first circuit board is disposed over the magnetic member and is electrically connected to the magnetic member;
   a second circuit board disposed in the casing, wherein the second circuit board is in a stack arrangement with the first circuit board and is electrically connected to the first circuit board;
   a plurality of connectors disposed on the second circuit board and located in the opening of the casing; and
   at least one first fastener, wherein the magnetic member comprises at least one conductive pin, the first fastener passes through the first circuit board and fixedly engages the conductive pin of the magnetic member.

8. The power supply device of claim 7, further comprising a pillar fixedly attached to the second circuit board and abutting against a bottom surface of the casing.

9. The power supply device of claim 7, wherein the second circuit board comprises at least one conductive standoff structure, and the first circuit board is in contact with the conductive standoff structure.

10. The power supply device of claim 9, further comprising at least one second fastener, wherein the second fastener passes through the first circuit board and fixedly engages the conductive standoff structure of the second circuit board.

11. The power supply device of claim 7, further comprising a thermal gel, wherein the casing has a recess, the magnetic member is disposed in the recess, the thermal gel is disposed in the recess and covers the magnetic member.

* * * * *